US012125634B2

(12) United States Patent
Dumoulin

(10) Patent No.: US 12,125,634 B2
(45) Date of Patent: Oct. 22, 2024

(54) APPARATUS AND SYSTEM TO MAXIMIZE HEAT CAPACITY IN CRYOGENIC DEVICES

(71) Applicant: CHILDREN'S HOSPITAL MEDICAL CENTER, Cincinnati, OH (US)

(72) Inventor: Charles Lucian Dumoulin, Cincinnati, OH (US)

(73) Assignee: CHILDREN'S HOSPITAL MEDICAL CENTER, Cincinnati, OH (US)

( * ) Notice: Subject to any disclaimer, the term of this patent is extended or adjusted under 35 U.S.C. 154(b) by 539 days.

(21) Appl. No.: 17/466,500

(22) Filed: Sep. 3, 2021

(65) Prior Publication Data

US 2022/0068530 A1    Mar. 3, 2022

Related U.S. Application Data

(60) Provisional application No. 63/073,993, filed on Sep. 3, 2020.

(51) Int. Cl.
*H01F 6/04* (2006.01)
*G01R 33/3815* (2006.01)

(52) U.S. Cl.
CPC .......... *H01F 6/04* (2013.01); *G01R 33/3815* (2013.01)

(58) Field of Classification Search
CPC ............................. H01F 3/04; G01R 33/3815
See application file for complete search history.

(56) References Cited

U.S. PATENT DOCUMENTS

| | | | |
|---|---|---|---|
| 5,410,286 A | 4/1995 | Herd et al. | |
| 6,107,905 A | 8/2000 | Itoh et al. | |
| 8,633,692 B2 | 1/2014 | Strobel et al. | |
| 2010/0248968 A1 | 9/2010 | Stautner | |
| 2015/0369885 A1 | 12/2015 | Ito et al. | |
| 2016/0329138 A1 | 11/2016 | Morita | |
| 2020/0340626 A1* | 10/2020 | Chorley | ................ F17C 13/007 |

* cited by examiner

*Primary Examiner* — Nael N Babaa
(74) *Attorney, Agent, or Firm* — BakerHostetler

(57) ABSTRACT

Apparatus and methods to add heat capacity to a cryogenic apparatus such as a superconducting magnet are provided. A body of liquid cryogen having a relatively high heat capacity is stored at cryogenic temperatures in a low temperature vessel that is thermally linked to a cold mass within the cryogenic apparatus. The low temperature vessel is connected to a manifold system located on the exterior of the cryogenic apparatus. The manifold is further connected to a room temperature vessel so that gas is allowed to freely move between the low temperature and room temperature vessels. In one exemplary mode of operation, it is possible to simultaneously operate the system with a full capacity of liquid cryogen in the low temperature vessel, operate the system with a maximum pressure substantially below 757 atmospheres regardless of the temperature of the low temperature vessel, operate the system with positive pressure regardless of the temperature of the low temperature vessel, and cycle the temperature of the low temperature vessel between room and cryogenic temperatures without releasing gas from the system.

29 Claims, 5 Drawing Sheets

APPARATUS AND SYSTEM TO MAXIMIZE HEAT CAPACITY IN CRYOGENIC DEVICES

CROSS-REFERENCE TO RELATED APPLICATIONS

The current application claims priority to U.S. Provisional Application, Ser. No. 63/073,993, filed Sep. 3, 2020; the entire disclosure of which is incorporated by reference.

BACKGROUND

Devices operating at temperatures close to absolute zero are used in a number of important applications including Magnetic Resonance Imaging (MRI), cyclotrons for the production of radioactive isotopes, cyclotrons for the production of therapeutic proton beams, particle accelerators used for high-energy research, magnets for improving the purity of crystals during crystal growth, and the like. Many of these applications seek to lower the temperature of superconducting wire to put the wire into a superconductive state so that the wire can support electrical current without resistance. In many of these applications the use of cryogenic temperatures is the only available technical recourse to meet the need. For example, the creation of a sufficiently stable and uniform 1.5 Tesla or 3.0 Tesla magnetic field over the dimensions of a human body used in MRI has only been achieved to date with superconducting magnets operating at cryogenic temperatures.

A variety of superconducting wire formulations and designs are known to those skilled in the art. In general, superconducting wire falls into one of two categories: Low Temperature Superconductors (LTS) and High Temperature Superconductors (HTS). Wires constructed with Niobium Tin (NbSn) or Niobium Titanium (NiTi) are LTS wires, while formulations such as Magnesium di-Boride ($MgB_2$) are considered to be HTS. In general, LTS wires operate at temperatures close to absolute zero, and often are cooled with liquid helium held at atmospheric pressure and boiling at 4.2 degrees Kelvin. Many HTS formulations can operate at liquid nitrogen temperatures (i.e. 77 degrees Kelvin), but because of their mechanical properties and expense, HTS wires are not as widely used as LTS wires. For the purpose of this disclosure, "cryogenics" and "cryogenic temperatures" means temperatures approximately equal to the boiling point of liquid helium, and indeed the current disclosure is directed towards devices employing liquid helium. It should be noted, however, that the principles and spirit of the current disclosure are applicable to HTS devices operating with liquid nitrogen or other low temperature liquids.

An important aspect of superconducting wire is that it exists in one of two states, and there is a discrete transition between these states. At room temperature LTS wire has a non-zero resistance and behaves like ordinary conductive wire. This state is called the "normal" state. When certain conditions are met, however, the LTS wire enters the "superconducting" state in which it has zero resistance. Three independent parameters govern the transition between normal and superconducting states. These are: the wire's current density, J, the magnetic field, B, and the temperature of the wire, T. The precise values of these parameters at the transition between normal and superconducting states depends on the formulation and construction of the superconducting wire. Furthermore, there is an interdependency between these parameters. For example, if the magnetic field and current density in the wire are low, the transition temperature at which the wire becomes superconducting is relatively high, but as the field and/or current density are increased, the critical temperature decreases. Consequently, there is an operational envelope defined by current density, magnetic field, and temperature that defines the transition between the normal and superconducting states. It should be noted that the operating parameters within an LTS device may vary as a function of location within the device, and thus certain portions of the device may operate closer to the superconducting transition envelope than others.

For the purpose of illustration it is useful to consider a magnet constructed with LTS wire. The magnet can be assembled at room temperature and consists of one or more coils of LTS wire, each coil having a selected number of turns. The coils are connected to each other in serial fashion and the first coil is connected to the last to create a complete circuit. The magnet is designed so that when electrical current passes through the winding, a magnetic field is created inside the coils. Immediately after assembly, the current in the wire is zero and the wire is at room temperature. Consequently, the LTS wire is in the normal state. Current can be introduced into the winding to create a magnetic field, but it must be maintained by an external power supply. Furthermore, because the wire has a non-zero electrical resistance, the current causes the wire to heat up.

To operate the magnet below the superconducting transition envelope, the LTS wire must be cooled to cryogenic temperatures. This can be accomplished by placing the windings in a suitably designed cryostat and lowering the temperature of the windings using cryogenic liquids and/or a cryocooler system. At some point in the cool down, the temperature of the LTS wire in the magnet windings becomes lower than the critical temperature of the wire, and the wire enters the superconducting state. Now, when electrical current is introduced to the wire, the current flows without resistance and no heat is generated in the windings. As the current is increased the magnetic field created by the windings also increases. However, as more and more current is added, the operational point of the LTS wire becomes closer to the superconducting transition envelope. In general the design parameters of the magnet are chosen so that the desired magnetic field can be achieved without crossing this envelope.

If the operating conditions of the magnet exceed the superconducting transition envelope anywhere within the LTS wire, then that segment of wire will enter the normal state. The segment of LTS wire in the normal state develops non-zero resistance and thus, the current in the wire generates heat. This heat will warm the surroundings of the wire and force more wire into the normal state. This process, called quenching, rapidly converts all of the energy contained in the electrical current flowing through the windings into heat, and causes a collapse of the magnetic field. It is worth noting that most quenches in superconducting magnets are caused by elevated temperatures since the magnetic field and the electrical current in the wire are typically well-understood and controlled. Increased temperatures can be caused by failures in the cryogenic system of the apparatus or by the release of mechanical energy when a portion of the apparatus yields suddenly to the forces within the system. This latter scenario accounts for "training quenches" that can occur during the commissioning of a superconducting magnet.

Liquid helium is commonly used for cryogenic systems and has a number of unique properties that make it useful. At atmospheric pressure, liquid helium boils at 4.2 degrees Kelvin. At this temperature all other materials are solid. Furthermore, at this temperature substantially all other materials have diminished heat capacity and diminished thermal conductivity. Liquid helium, however, retains it fluidity and indeed becomes super-fluid at approximately 2.18 degrees Kelvin. At cryogenic temperatures helium also has a high heat capacity and high thermal conductivity with respect to other materials.

Cryogenic systems that operate at 4.2 degrees Kelvin are relatively straightforward to those skilled in the art. The general approach to designing such a system is the creation of a well-insulated cryostat that minimizes the ingress of external heat and allows liquid helium to be collected and maintained at atmospheric pressure. Since all other materials are solid at this temperature the only option for the gas above the liquid helium is gaseous helium. In many devices the liquid helium is generated outside of the device and transferred into the cryostat via an insulated line. The helium is then allowed to slowly evaporate and maintains the device at 4.2 degrees Kelvin until the helium is fully consumed. In many superconducting MRI systems, the magnet windings are submerged in as much as 2000 liters of liquid helium. To reduce cost and save on the consumption of helium, these systems typically employ a cryocooler located at the top of the cryostat to condense gaseous helium and return it to the helium bath. These cryocoolers typically have a Gifford-McMahon (GM), or pulse tube design, but other configurations are possible. In order to condense gaseous helium at atmospheric pressure the cryocooler needs to operate at temperatures below 4.2 degrees Kelvin. In general, the cooling power of the cryocooler is selected to be greater than the heat that enters the cryostat. This allows the magnet to continue to operate over a range of cryocooler efficiency, but creates an operational challenge since the liquefaction of helium gas will cause the pressure of the gas above the liquid helium to become sub-atmospheric. Although sub-atmospheric helium baths can be useful for attaining temperatures below 4.2 degrees Kelvin, operating the system at sub-atmospheric pressure is dangerous since any leaks in the system will allow air to be sucked into the cold space where it will solidify. Solid air can block the exit route for helium gas in the event of a quench, and places the magnet cryostat at risk of rupturing during a quench. Consequently, most superconducting magnets are equipped with a small electric heater that heats the helium to keep the helium gas pressure above atmospheric pressure. The heater is controlled by a pressure sensor, and the diminishment of heater current over time is frequently used as a service indicator of a failing cold head. It is worth noting that loss of cold head function in a conventional helium reservoir magnet does not typically pose an emergency situation since it may take several weeks for the helium in the reservoir to evaporate.

Conventional superconducting magnets with large liquid helium reservoirs must be constructed with quench vents to permit the large volume of gas created during a quench event to safely escape the magnet cryostat. These pipes are typically connected to an external vent pipe to allow the gas to be vented outdoors. A key element of the quench vent system is a burst disk that is placed inside the quench vent. During normal operation, the burst disk acts as a wall that prevents the ingress of air into the cryogenic space. This wall is strong enough to withstand the slight positive pressure generated by the heater system during normal operation, but shatters with the over-pressure generated by a quench event. After every quench, the burst disk must be replaced before the magnet is refilled with liquid helium The existence of a helium bath adds complexity to the device's design and adds operational cost since recovery from a quench event requires the replacement of the burst disk and liquid helium An alternate design approach is to place a cryocooler in direct or indirect contact with the cold mass of the device and to provide thermal conduction paths to remove heat from the cold mass via the cold head. This approach is known as conduction cooling to those skilled in the art. Conduction cooling eliminates the need for a liquid helium bath, but can present its own challenges. For example, vibrations produced by a directly-coupled cold head may be propagated into the cold mass and have undesired detrimental effects on the device. For example, cold head-induced vibrations are known to cause magnetic field instability in superconducting magnets using direct cryocooler connection to the cold mass. Consequently, it may be desirable to turn off of the cold head during scanning to prevent cold head-induced imaging artifacts. However, once the cold head is turned off, heat is no longer removed from the cold mass and the cold mass begins to warm. In most conduction cooled magnets the time between stopping the cold head and magnet quench, also known as "ride-through" time, is relatively short (for example, several minutes). A short ride-through time is also problematical when the cold head stops due to power outage, compressor failure, or loss of primary cooling of the compressor.

One method to extend ride-through time in conduction cooled magnets is to place a small reservoir of helium in thermal contact with the cold mass. This reservoir is designed to take advantage of the relatively high heat capacity of helium at cryogenic temperatures and helium's heat of vaporization to create a thermal buffer. Unlike a conventional liquid helium reservoir, this buffer is designed as a high-pressure vessel that does not need to fully release its helium in the event of a quench. In one manifestation, a fully sealed buffer can be attached to the cold mass during magnet construction. In another manifestation, the buffer can be connected to the exterior of the cryostat via a high-pressure pipe and selectively filled or emptied while the magnet is warm or cold. While a fully sealed buffer may provide advantages during the operational life of the magnet, it does represent a safety hazard when the magnet is decommissioned.

By mass, liquid helium has a much greater heat capacity at cryogenic temperatures than materials used to construct the cold mass. Consequently, the maximum heat capacity the cryogenic device as a whole is realized when the buffer is full of liquid helium. If the buffer has a volume, V, of liquid helium at 4.2 degrees Kelvin and 1 atmosphere of pressure, then that helium can be converted into a volume approximately 757 times greater at room temperature and pressure. However, if that amount of gas is constrained to the same volume, V, then the pressure within the buffer will rise to approximately 757 atmospheres at room temperature. If the buffer is designed to fully retain gas, then it must be constructed to withstand this pressure with a suitable safety margin. Thus, buffer vessels must be exceptionally strong if the full heat capacity potential of the buffer is to be realized.

Alternatively, a thermal buffer system can be designed to release at least a portion of the gas to the exterior of the cryostat if the pressure exceeds a selected pressure. This is easily accomplished with a high-pressure pipe connecting the buffer vessel to the exterior of the cryostat and a pressure relief valve. An operational risk of this approach, however, is that once helium gas is released, the next time the buffer is cooled to cryogenic temperatures there will be less helium in the system. This results in diminished heat capacity and sub-atmospheric pressure in the buffer once it is back to operational temperature. Furthermore, if the pressure relief valve fails to stop the ingestion of air into the buffer, air can freeze into a solid plug that blocks the escape of gas the next time the helium warms enough to become a gas. This can have catastrophic consequences resulting in buffer rupture. Consequently, it is desirable to refill the buffer to both maximize heat capacity to maximize magnet ride-through time, and to keep a positive pressure in the buffer system to prevent the ingress of air.

SUMMARY

As can be seen from the discussion above, there is a need for an apparatus and/or system that provides as much heat capacity as possible in a conduction-cooled superconducting magnet, while at the same time minimizing the risk of air ingression into the system. Maximizing heat capacity maximizes the ride-through time of the superconducting magnet when the cold head is turned off, and maintaining a positive pressure within the buffer system overcomes the risks of air ingression and the hazards associated with frozen air in the buffer.

Embodiments of the current disclosure provide a thermal buffer system used with a cryogenic device. Such embodiments are distinct from prior-art thermal buffer systems in that such embodiments have two or more interconnected buffer vessels. At least one of these vessels is in thermal contact with the cold mass of the cryogenic device and is held at cryogenic temperatures. At least one of the remaining vessels in the system are external to the cryostat and are held at room temperature. When the cryogenic buffer vessel in the system is at cryogenic temperatures it can be substantially filled with liquid helium at a pressure slightly above atmospheric pressure. Thus, small leaks in the system cause helium to escape, thereby preventing the ingress of air. If desired, any helium escaping the system can be replenished with a helium supply suitable for delivering helium gas into the system to maintain a desired pressure. When the cryogenic buffer vessel of the system is warmed, the helium liquid within the cryogenic vessel is converted to helium gas which expands and pressurizes both the cryogenic and room temperature buffer vessels. The size of the room temperature buffer vessel is selected such that the pressure in the system does not exceed the set point of a pressure relief valve and thus, no helium is released even if the entire system reaches room temperature. In an embodiment the existence of the pressure relief valve is optional and serves only as a safety device in the event the operational gas pressure approaches the design limits of the system.

Embodiments of the current disclosure provide a means to enable a thermal buffer in a cryogenic device to operate fully filled with liquid cryogens held at a pressure above atmospheric pressure. One benefit provided by this aspect of the current disclosure is the ability to maximize the thermal mass of a buffer system to maximize ride-through in a superconducting magnet. In addition, embodiments of the current disclosure provide for a thermal buffer system in which all of the liquid in the buffer can be converted into gas without the need for releasing the gas into the atmosphere outside of the buffer system. This aspect saves on cryogen expense. A third benefit of the current disclosure is that the pressure within a cryogenic buffer constructed in accordance with the current disclosure never exceeds a selected design value. This aspect of the current disclosure allows the buffer to be constructed with lighter weight materials and/or thinner walls to reduce expense, increase safety and reliability, and to maximize the volume of the liquid cryogen used within the buffer. A fourth benefit of the current disclosure is that a buffer constructed in accordance with the current disclosure can operate at a pressure that is never lower than atmospheric pressure. With this aspect, leaks within the system cause gas to exit the system rather than allowing air to enter into the cryogenic buffer where it can freeze and form a solid plug. The current disclosure may find use in superconducting magnets used for magnetic resonance imaging, cyclotrons for radioisotope generation, cyclotrons for radiation therapy, high-energy particle accelerators, magnet systems for crystal growth and the like.

In the absence of the embodiments described in current disclosure, a sealed buffer vessel inside a cryogenic device such as a superconducting magnet must either be very heavily constructed if it is full of liquid helium at cryogenic temperatures, or it must contain less liquid helium than the buffer volume so that at room temperature the pressure within the vessel does not exceed the vessel's capability to withstand a given pressure. If the vessel is only partially filled with liquid helium, then by necessity the pressure within the vessel will be less than one atmosphere when the vessel is at cryogenic temperatures. It is worth noting that in contrast with prior art sealed buffer systems, the current disclosure enables the design of a buffer that can be both full of liquid helium and constructed with thin walls since the maximum pressure of the buffer system can be selected to be substantially lower than that of a full sealed buffer.

In the absence of the current disclosure, a buffer vessel that is connected to the exterior of the cryostat inside a cryogenic device such as a superconducting magnet must either be very heavily constructed to prevent rupture when the vessel is at room temperature, or it must contain less liquid helium than the buffer volume so that at room temperature the pressure within the vessel does not exceed the vessel's capability to withstand a given pressure. A buffer that is connected with one or more pipes to the exterior of the cryostat can be protected from rupture with the inclusion of a pressure relief valve set to a selected pressure. Since the maximum pressure of such a buffer is reduced, it is possible to construct the buffer with a lower burst rating. However, if the pressure relief valve has a set point of less than approximately 757 atmospheres, by necessity some of the liquid helium will be vented and lost when the buffer warms up. If the lost helium is not replenished, the next time the buffer system attains cryogenic temperatures, it will have less helium and the helium will have negative pressure relative to the atmosphere. It is worth noting that in contrast with prior art buffer systems with connections to an external manifold, embodiments of the current disclosure enable the design of a buffer that can be both full of liquid helium and have sufficient expansion capacity so that no helium is released to the atmosphere if the buffer system is warmed up. Furthermore, a buffer system built according to the current disclosure never develops negative pressure, even after cycling between cryogenic and room temperatures.

It is straightforward to show that embodiments of the current disclosure are novel by comparing the performance attributes of the current disclosure to thermal buffers that are already known in the field. An exemplary thermal buffer of the current disclosure can simultaneously: A) operate with a full capacity of liquid helium, B) operate with a maximum pressure substantially below 757 atmospheres, C) operate with positive pressure at all temperatures, and D) cycle between room and cryogenic temperatures without releasing helium. Neither sealed buffer systems nor prior-art externally connected buffer systems can simultaneously achieve all four of these characteristics.

The current disclosure will now be described in more detail with reference to exemplary embodiments thereof as shown in the accompanying drawings. While the current disclosure is described below with reference to exemplary embodiments, it should be understood that the claims are not intended to be limited thereto. Those of ordinary skill in the art having access to the teachings herein will recognize additional implementations, modifications, and embodiments, as well as other fields of use, which are within the scope of the current disclosure as described herein, and with respect to which the current disclosure may be of significant utility. Those of ordinary skill will also recognize that it is not necessary to achieve all of the benefits, objects or advantages stated in the current disclosure while falling within the scope of the claims as unstated benefits, objects and advantages may exist beyond what is disclosed.

DETAILED DESCRIPTION

Cooling a device to temperatures within a few degrees of absolute zero is a key requirement in many applications. For example, devices employing Low Temperature Superconducting (LTS) wire for the creation of magnetic fields need to operate at temperatures below the superconducting transition temperature of the LTS wire. Superconducting magnets are essential components of many magnetic resonance imaging systems, cyclotrons, particle accelerators, and laboratory test fixtures. Commonly, these systems employ a bath of liquid helium that is held at atmospheric pressure or slightly higher than atmospheric pressure. Helium bath systems operating at near-atmospheric pressure keep the liquid helium in a boiling condition and thus, the cryogenic portion of the device operates at 4.2 degrees Kelvin, even if a cold head used to cool the system is capable of lower temperatures. In general, there is a desire to operate a cryogenic device with as low a temperature as possible, and temperatures below 4.2 degrees Kelvin can be advantageous.

One approach to operating a cryogenic device below 4.2 degrees Kelvin is to forgo the use of a cryogenic bath and employ a direct connection between the cold head and the cold mass. This approach is known as conduction cooling to those skilled in the art. Conduction cooling eliminates the need for a liquid helium bath, but can present its own challenges. For example, vibrations produced by a directly-coupled cold head may be propagated into the cold mass and have undesired detrimental effects on the device. Cold head-induced vibrations are known to cause magnetic field instability in superconducting magnets using direct cryocooler connection to the cold mass. Consequently, it may be desirable to turn off of the cold head during scanning to prevent cold head-induced imaging artifacts. However, once the cold head is turned off, heat is no longer removed from the cold mass and the cold mass begins to warm. In most conduction cooled magnets the time between stopping the cold head and magnet quench, also known as "ride-through" time, is relatively short (for example, several minutes). A short ride-through time is problematical when the cold head stops due to power outage, compressor failure, or loss of primary cooling of the compressor.

Figure 1:
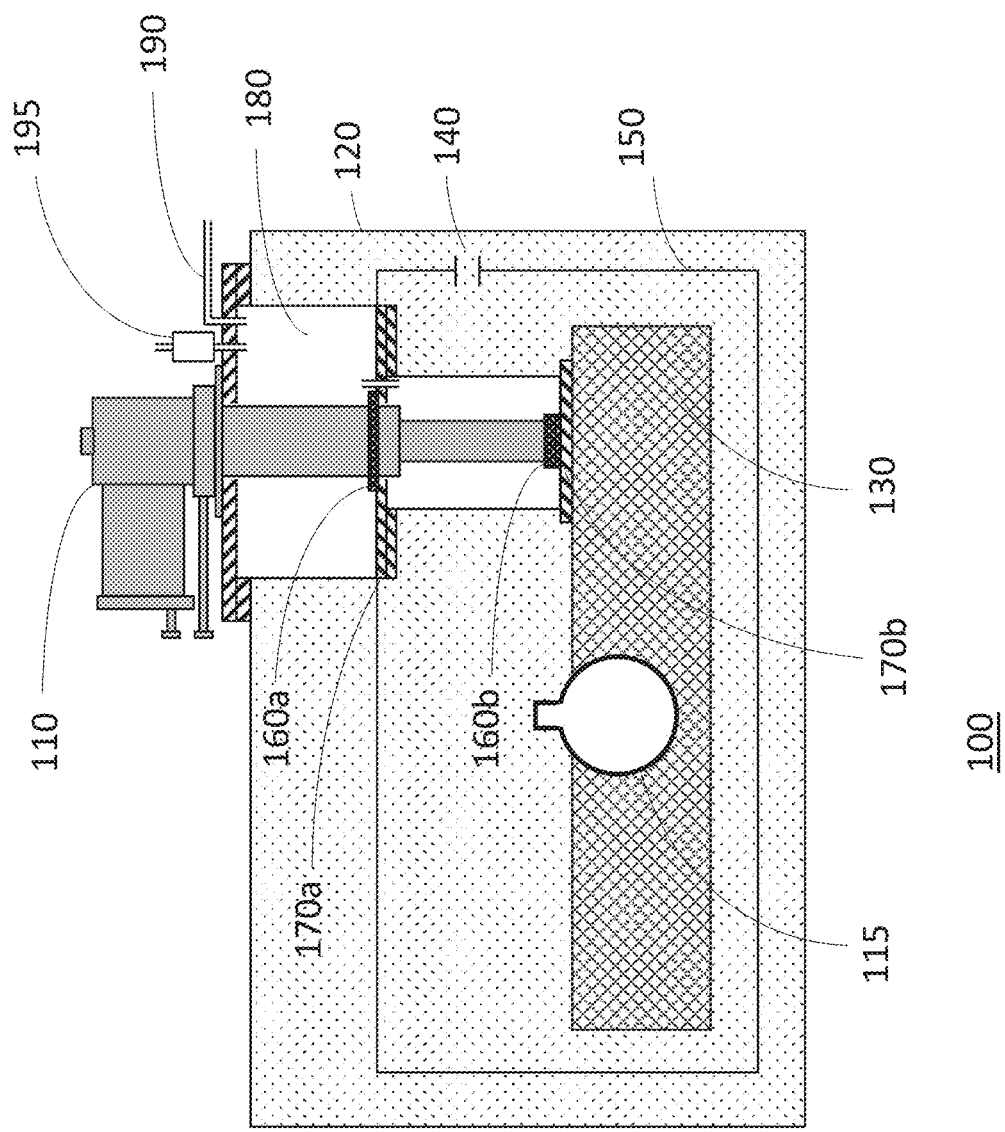
FIG. 1 is a diagram representation of a sealed buffer system attached to a cold mass which is cooled by a cold head using a configuration well known to those skilled in the art.

FIG. 1 shows an exemplary cryogenic system 100 in which a cold head 110 is used to remove heat from a generic cryogenic device which is comprised of a cryostat 120 that provides thermal insulation to minimize the ingress of heat to a cold mass 130 contained within the cryostat. To minimize the transfer of heat to the cold mass a vacuum 140 is established inside cryostat 120 and a radiation shield 150 is disposed between the outer wall of cryostat 120 and cold mass 130. Cold head 110 can have a Gifford-McMahon (GM), or pulse tube design, but other configurations are possible. In the exemplary system shown in FIG. 1 cold head 110 is comprised of a first stage 160a and a second stage 160b. First stage 160a is interfaced to a radiation shield thermal link 170a and second stage 160b is interfaced to a cold mass thermal link 170b. Radiation shield thermal link 170a is connected to radiation shield 150 in such a way as to facilitate heat transfer from radiation shield 150. Likewise, cold mass thermal link 170b is connected to cold mass 130 in such a way as to facilitate heat transfer from cold mass 130. Configurations employing additional radiation shields, radiation shields covered in reflective material, and cold mass suspension systems designed to minimize heat transfer are well-known to those skilled in the art.

Cold head 110 is disposed in the cryostat in a cold head chamber 180. Cold head chamber 180 is connected via plumbing to an evacuation/fill port 190 and a pressure relief valve 195. In some exemplary systems cold head chamber 180 can communicate with vacuum 140, but in general, cold head chamber 180 is designed to not communicate with vacuum 140 to permit cold head 110 to be changed without requiring vacuum 140 to be lost. If desired, cold head chamber 180 can be operated with a vacuum, or with helium gas at a selected pressure above, below, or equal to atmospheric pressure. In general, the use of other gasses is inadvisable since at liquid helium temperature all gasses other than helium become solid.

When cold mass 130 is at temperatures close to absolute zero degrees, its heat capacity is greatly reduced. Consequentially, the addition of small amounts of energy can cause a greater increase in temperature than the same amount of energy would cause if added when the cold mass is at a warmer temperature. A practical consequence of this phenomenon is that when cold head 110 is turned off the temperature of cold mass 130 can quickly elevate to be above the superconducting transition point of LTS wire, resulting in ride-through times of only a few minutes. One method that is known to those skilled in the art is to take advantage of the relatively high heat capacity of liquid helium at temperatures close to absolute zero by maintaining a selected amount of liquid helium in a sealed buffer vessel 115 in thermal contact with the cold mass 130. While the pressure within sealed buffer vessel 115 may be moderate or even below atmospheric pressure when the vessel is at liquid helium temperatures, by necessity, the pressure increases when sealed buffer vessel 115 is at room temperature. Since the expansion factor of helium from the liquid state to the gaseous state at room temperature is 757, if sealed buffer vessel 115 is filled with liquid helium at one atmosphere at cryogenic temperatures, its pressure will be 757 atmospheres at room temperature. Thus, sealed buffer vessel 115 must be very robustly constructed if the full thermal buffer potential is to be realized. Alternatively, one can place less than a full load of liquid helium in sealed buffer vessel 115 so that when the vessel is at room temperature a selected lower gas pressure is present. For example, sealed buffer vessel 115 can be charged with 100 atmospheres of gaseous helium at room temperature. When the temperature in sealed buffer vessel 115 decreases to approximately 4 degrees Kelvin, however, the vessel has a pressure of approximately 100/757=0.13 atmospheres and is only approximately 13% full of liquid helium. Thus, operating sealed buffer vessel 115 at less than 757 atmospheres when at room temperature reduces its thermal buffer capacity at cryogenic temperatures.

Figure 2:
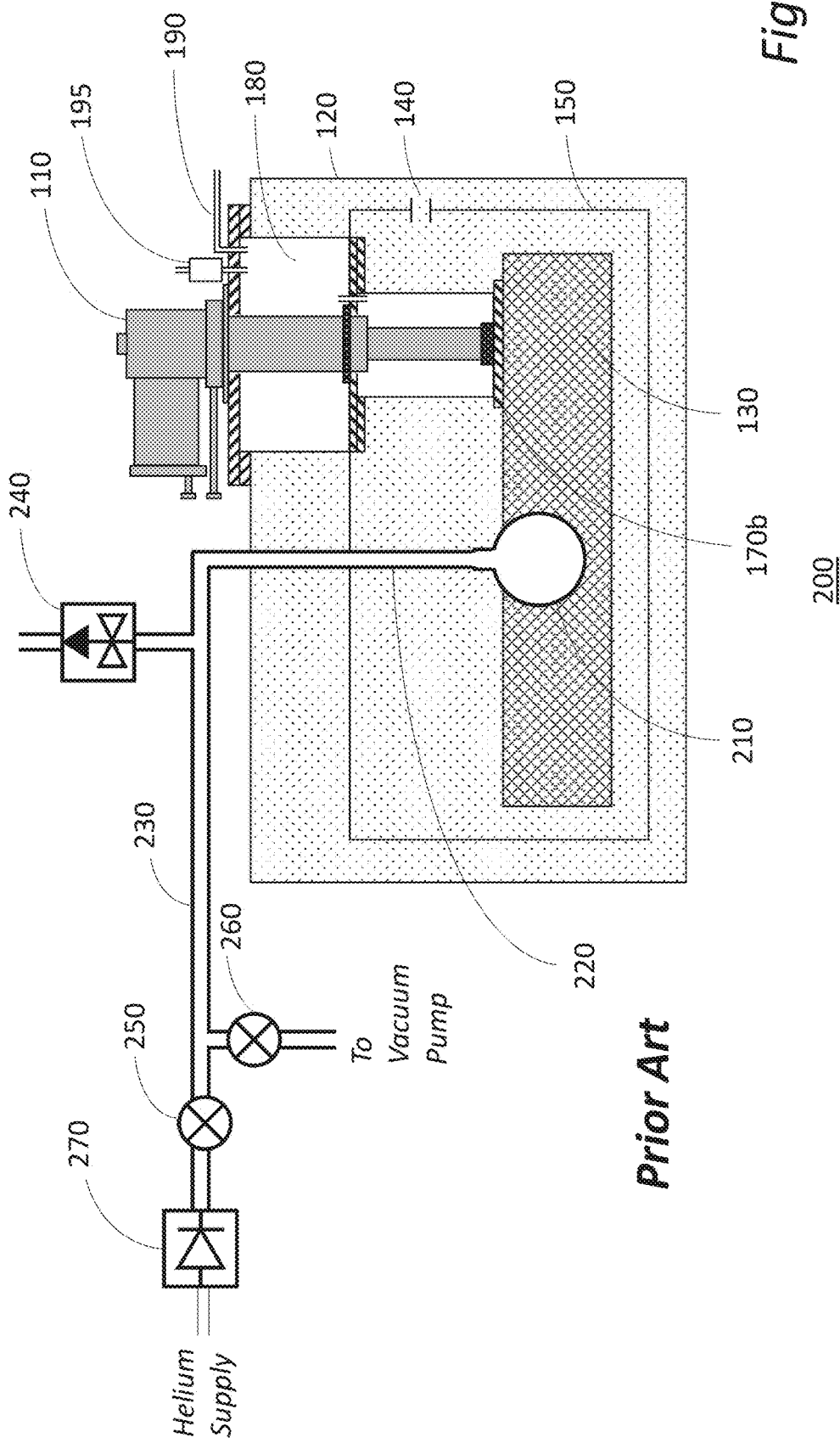
FIG. 2 is a diagram representation of a buffer system attached to a cold mass cooled by a cold head with said buffer system having a connection to a room-temperature manifold outside of the cryostat using a configuration well known to those skilled in the art.

FIG. 2 shows an alternate embodiment cold buffer system 200 in which a thermal buffer can be used in a cryogenic device. This embodiment has a similar configuration to that previously disclosed by Herd et al. in U.S. Pat. No. 5,410,286 which is hereby incorporated by reference. It should be noted that although Herd et al. disclose a buffer containing compressed helium gas above the temperature needed to liquefy helium, their thermal buffer configuration is suitable for containing liquid helium if desired. Here, a cold buffer 210 is in thermal contact with cold mass 130, but unlike sealed buffer vessel 115 from FIG. 1, cold buffer 215 has at least one pipe 220 that connects to the exterior of cryostat 120. Outside of cryostat 120 pipe 220 is connected to a high pressure manifold 230 that is connected to a pressure relief valve 240, a supply service valve 250, and a vacuum service valve 260. Supply service valve 250 can be used to admit gas into the system from a helium supply, and if desired a one way valve 270 can be deployed between the helium supply and high pressure manifold 230. Vacuum service valve 260 can be used to connect high pressure manifold 230 to a vacuum pump to evacuate the manifold and connected elements.

Figure 3:
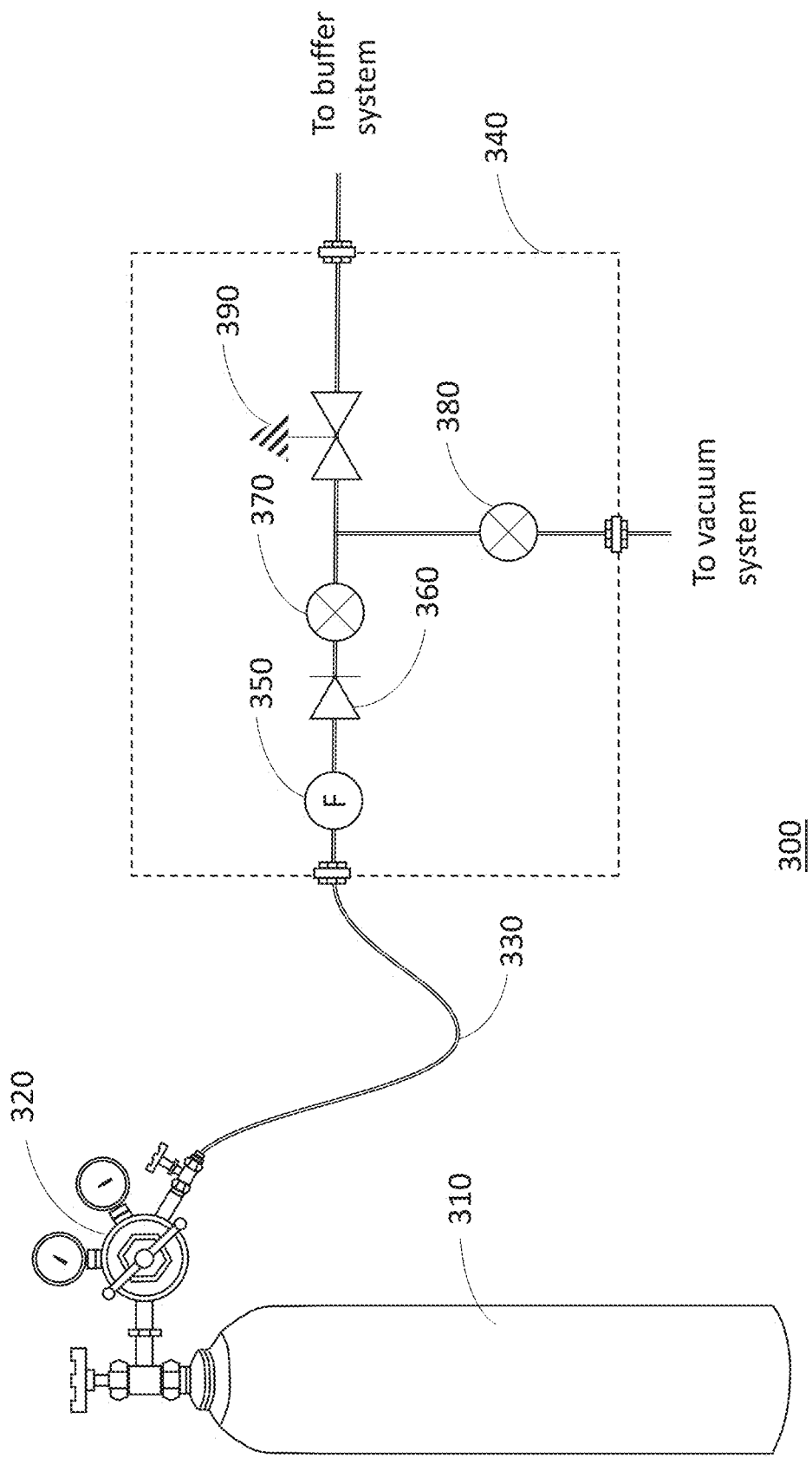
FIG. 3 is a schematic diagram of an exemplary pressure maintenance system according to the current disclosure.

Maintenance of a constant pressure in cold buffer 210 can be accomplished using a variety of approaches. An exemplary approach 300 is shown in FIG. 3 where a gas supply bottle 310 having a selected amount of gas stored at a selected pressure provides a source of helium gas for the system. Pressure in gas supply bottle 310 is typically chosen to be relatively high and a pressure regulator 320 is used to provide lower pressure gas to the system. This lower pressure is typically chosen to be above atmospheric pressure so that gas will flow out of gas supply bottle 310 and into the system. It should be noted that other embodiments of approach 300 could employ a pump, or other suitable apparatus to provide a suitable pressure. Gas from pressure regulator 320 passes through a gas delivery hose 330 that is connected to a manifold 340 which is comprised of a flow meter 350, a one way check valve 360, a supply service valve 370, a vacuum service valve 380, and a pressure relief valve 390. In this embodiment, flow meter 350 is fluidically coupled to the delivery hose 330, the check valve 360 is fluidically positioned between the flow meter 350 and the supply service valve 370, the pressure relief valve is fluidically coupled between the supply service valve 370 and the cold buffer system 200, and the vacuum service valve 380 is fluidically coupled between the vacuum system and a line between the supply service valve and the pressure relief valve. Manifold 340 is connected to cold buffer system 200. Thus, by closing of supply service valve 370 and opening vacuum service valve 380, it is possible to evacuate cold buffer system 200. Then, by closing vacuum service valve 380 and opening supply service valve 370, the gas pressure selected at pressure regulator 320 is maintained in cold buffer system 200. Preferably, the set point for pressure relief valve 390 is selected to be above the pressure selected at pressure regulator 320, and below the burst pressure of manifold 340 and cold buffer system 200. It should be noted that the details of the manifold presented here are exemplary and that other configurations may be apparent to those skilled in the art.

Figure 4:
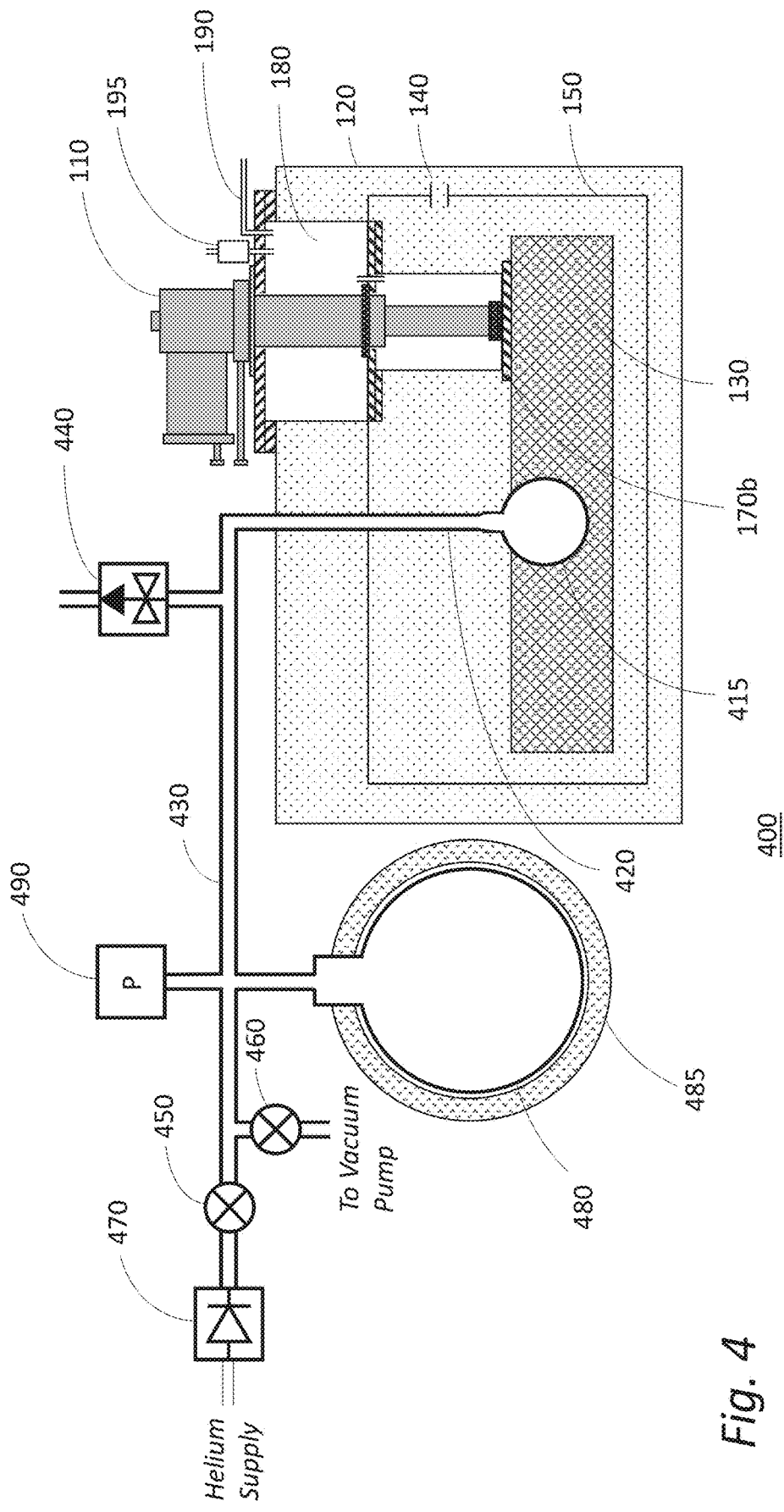
FIG. 4 is a schematic representation of an exemplary embodiment of the current disclosure in which a room temperature buffer is attached to the cryogenic buffer system.

FIG. 4 illustrates a cryogenic system 400 employing a preferred embodiment of the current disclosure. As with prior art systems, cold head 110 is used to cool cold mass 130 inside cryostat 120. At least one radiation shield 150 is disposed in vacuum 140 to minimize the flow of heat from the walls of cryostat 120 into cold mass 130. As with prior art systems a low temperature buffer vessel 415 is placed in thermal contact with cold mass 130, and low temperature buffer vessel 415 is connected by at least one connection pipe 420 to the exterior of cryostat 120. Unlike prior art systems, however, connection pipe 420 is connected to a high pressure manifold 430 which allows low temperature buffer vessel 415 to communicate with a buffer pressure relief valve 440, a supply service valve 450, a vacuum service valve 460, and a rigid room temperature buffer vessel 480. If desired, a pressure sensor 490 can be connected to high pressure manifold 430. Supply service valve 450 can be used to admit gas into the system from a helium supply such as the one described in FIG. 3, and if desired a one way valve 470 can be deployed between the helium supply and high pressure manifold 430. Vacuum service valve 460 can be used to connect high pressure manifold 430 to a vacuum pump to evacuate the manifold and connected elements. If desired, room temperature buffer vessel 480 and high pressure manifold 430 can be substantially surrounded by thermal insulation 485 to reduce the accumulation of water and air condensation on the external surfaces of room temperature buffer vessel 480 and high pressure manifold 430 when cold gas is present inside these portions of the system.

Room temperature buffer vessel 480 can be a single vessel of arbitrary shape, but it is within the scope of the current disclosure to provide multiple room temperature buffer vessels 480 attached to high pressure manifold 430. The aggregate volume of all room temperature buffer vessels 480 has a selected volume, $V_H$. Likewise, low temperature buffer vessel 415 can be a single vessel of arbitrary shape, but it is within the scope of the current disclosure to provide multiple low temperature buffer vessels 415 attached to one or more connection pipes 420. The aggregate volume of all low temperature buffer vessels 415 has a selected volume, $V_L$. Those skilled in the art will recognize that the use of multiple pressure vessels having a desired aggregate volume instead of a single vessel, permits the construction of stronger vessels for a given wall thickness and permits vessels to be more easily incorporated into an apparatus.

If the buffer system is fully charged such that the pressure, $P_0$, within the system is substantially one atmosphere and low temperature buffer vessel 415 is full of liquid helium, the maximum pressure that the system will generate in the absence of pressure relief valve 440 is determined by the ratio, R, of volumes $V_H$ and $V_L$.

$$R=V_H/V_L \quad [1]$$

Ignoring the amount of gaseous helium in high pressure manifold 430 and connection pipe 420, at cryogenic temperature the volume of liquid helium in the buffer system can be approximated as $V_L$ and the volume of gaseous helium can be approximated as $V_H=RV_L$. Since a given volume of liquid helium at cryogenic temperatures and one atmosphere expands with an expansion ratio, E, to a volume E times greater when the gas is heated to room temperature and held at one atmosphere, the total volume of helium in the system, V, at room temperature and pressure will be equivalent to:

$$V=P_0(EV_L+RV_L) \quad [2]$$

It is worth noting that if no helium is released from the system, this volume, V, of gas is contained within the buffer system that has a volume equal to $V_L+RV_L$. Thus, the pressure, P, of the system after it is warmed to room temperature will be:

$$P=V/(V_L RV_L) \quad [3]$$

$$P=P_0(EV_L+RV_L)/(V_L+RV_L) \quad [4]$$

$$P=P_0(E+R)/(1+R) \quad [5]$$

Since E is approximately equal to 757, and $P_0$ can be chosen to be approximately equal to one atmosphere, the maximum pressure, $P_{max}$, can be approximated to be:

$$P_{max}=(757+R)/(0+R) \quad [6]$$

Figure 5:
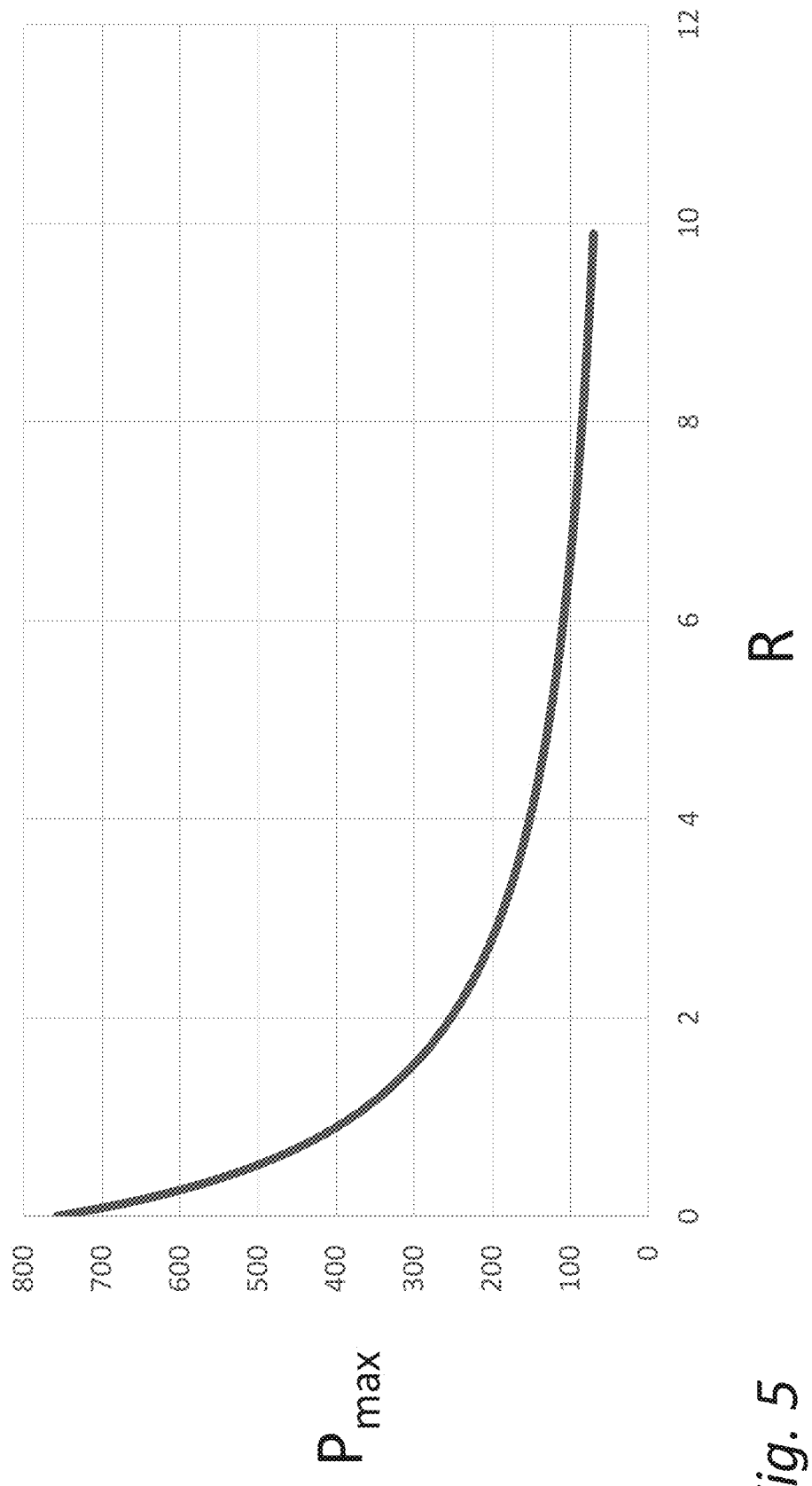
FIG. 5 is a graphical representation showing the maximum pressure generated in an exemplary embodiment of the current disclosure as a function of the ratio of the volumes of low temperature buffer vessel and room temperature buffer vessel.

This mathematical relationship is plotted in FIG. 5 which illustrates that the maximum pressure of the buffer system decreases as R gets larger. For example, a buffer system constructed with room temperature buffer vessel 480 having the same volume as low temperature buffer vessel 415, (i.e. R equals 1) will have a maximum pressure, $P_{max}$, equal to 758/2=379 atmospheres. If the system is to be designed so as to not release helium when fully warmed, then all of the elements must be constructed of strong enough materials to withstand this pressure with a comfortable margin. It can be seen, however, that by increasing R, the maximum pressure experienced by the buffer system can be greatly reduced. For example, if R equals 7, then $P_{max}$ is equal to 764/8=95.5 atmospheres.

In exemplary embodiments it is desirable to set the release pressure of relief valve 440 to a pressure that is above $P_{max}$ so that helium is not released when the system is warmed. In light of the difficulties and limitations presented by the construction of a buffer system able to accommodate high $P_{max}$, it can be appreciated by those skilled in the art that operating the buffer system with a lower $P_{max}$ is advantageous from a safety and cost perspective.

In an exemplary mode of operation, gasses within the buffer system are first evacuated by closing supply service valve 450 and opening vacuum service valve 460. Once the pressure within the buffer system is at a selected value indicating that a sufficient amount of gas has been evacuated from the system, vacuum service valve 460 is closed. At this point cold head 110 can be turned on to remove heat from cold mass 130 without concern for the condensation and freezing of air in the system. If desired, evacuation of the buffer system can be performed at a selected time after cold head 110 is turned on provided that cold mass 130 is sufficiently warm enough to prevent the formation of liquid or solid air. If desired, supply service valve can be opened to introduce helium into the system while the cold mass is still warm, or helium can be introduced once cold mass 130 has reached cryogenic temperatures. Once cold mass 130 is at cryogenic temperatures helium in low temperature buffer vessel 415 liquefies and fills low temperature buffer vessel 415. Presuming that the buffer system is maintained at approximately one atmosphere, liquid helium will collect in only those portions of the low temperature buffer vessel 415 and connection pipe 420 that have a temperature below 4.2 degrees Kelvin. It can be easily seen that if supply service valve 450 remains open and a constant gas pressure is provided, gas will be introduced into the system until low temperature buffer vessel 415 contains as much liquid helium as possible, and thus low temperature buffer vessel 415 will provide the maximum heat capacity possible.

When a fully charged thermal buffer system constructed and operated in accordance with the current disclosure is warmed above liquid helium temperatures (for example by a superconducting magnet quench), the liquid helium present in low temperature buffer vessel 415 is converted into gas which rushes out of connection pipe 420, through high pressure manifold 430, and into room temperature buffer vessel 480. If pressure relief valve 440 has been selected to have a release pressure greater than $P_{max}$, then no helium will be lost to the atmosphere. Note that one way valve 470 will prevent any high pressure gas from entering the helium supply system. The exterior surfaces of high pressure manifold 430 and room temperature buffer vessel 480 will become cold and could condense water and liquid air from the surroundings if not properly insulated. If cold head 110 is not active, then the entire system will eventually reach room temperature. At room temperature the pressure in the buffer system will be $P_{max}$. Once cold head 110 is restarted, however, the temperature in low temperature buffer vessel 415 will drop and eventually low temperature buffer vessel 415 will be cold enough to liquefy helium. Once low temperature buffer vessel 415 is full of helium, the pressure in the system will return to its nominal value which can be chosen to be slightly above atmospheric pressure to prevent ingress of air into the system.

Embodiments of current disclosure are distinct in several important aspects from the helium recovery system disclosed in U.S. Pat. No. 8,633,692 by Strobel et al. which is hereby incorporated by reference. Strobel discloses an external buffer for the collection of helium gas exiting a cryostat, but in contrast to the current disclosure, Strobel's buffer is expandable and operates at a maximum pressure close to atmospheric pressure. Strobel's disclosure describes a system that may be suitable for overcoming small heat loads caused by MR scanning, but it is not well suited for magnet quenches in which most or all of the liquid helium is converted into a very cold gas in the matter of a few seconds. A flexible buffer such as the one described by Strobel will freeze and rupture in the presence of the very cold gas, and if it retains its structural integrity, it will have to expand to a volume that is approximately 757 times larger than the volume of liquid helium in the system. Thus, a practical necessity of the Strobel invention is that cold gas during a quench scenario will have to be vented into the atmosphere. Furthermore, the Strobel system incorporates an evaporation line with control valves and a distinct return line with control valves to manage the movement of helium between the expanding buffer and the helium vessel in the cryostat. In the current disclosure only a single line is needed to manage the flow of helium gas between buffer vessels, and no control valves are needed. The absence of control valves in the embodiments of the current disclosure results in substantially uniform pressure in the entire buffer system, even as the pressure varies in response to changes in the temperature of low temperature buffer vessel 415. Furthermore, helium returned to the magnet cryostat of the Strobel invention is introduced directly to the cold head, whereas in the current disclosure, helium is introduced to low temperature buffer vessel 415 and it is never in direct contact with cold head 110. Unlike Strobel's system, embodiments of the current disclosure are intended to withstand a quench event without releasing helium gas or changing the dimension of the room temperature buffer vessel 480.

Embodiments of the current disclosure are distinct in several important aspects from the superconducting magnet system disclosed in U.S. Pat. No. 6,107,905 by Itoh et al. which is hereby incorporated by reference. Itoh discloses a superconducting magnet configuration with a coolant storage tank that is located either external to the magnet cryostat or integrated into the magnet cryostat. Itoh et al. explicitly state, however, that in their invention "an external gas storage tank is not needed" and their disclosure does not speak to the concept of retaining helium in the event of a quench. In comparison, room temperature buffer vessel 480 is an integral and essential component of preferred embodiments of the current disclosure. An additional distinction between Itoh and the current disclosure is that the cold head in the Itoh disclosure is in direct contact with liquid cryogens whereas in embodiments of the current disclosure the cold head is not in direct contact with cryogenic liquid. One can show that this is a material distinction by considering the consequence of removing helium from superconducting magnets constructed in accordance with each of the respective disclosures. In the absence of helium, the cold head in a superconducting magnet constructed according to Itoh would not be able to remove heat from the cold mass, and the superconducting wire in the magnet would not be maintained below its critical temperature. Removing helium from embodiments of the current disclosure by applying a vacuum to high pressure manifold 430 via vacuum service valve 460 will only reduce the heat capacity of the superconducting magnet apparatus, and thus reduce the ride through time of the magnet, but it will not affect the heat flow from cold mass 130 to cold head 110. Consequently, a magnet constructed in accordance with the current disclosure can operate in the absence of helium as long has the cold head is functioning properly, whereas a magnet constructed according to Itoh cannot operate in the absence of helium even with a functioning cold head. This distinction is also important in light of the high gas pressures that can be present during a magnet quench. With embodiments of the current disclosure the gas at high pressure, $P_{max}$, is fully contained within the buffer system and unlike the Itoh invention, there is no risk of gas leakage through or around the cold head.

It can be seen from the foregoing description that embodiments of the current disclosure provide for a thermal buffer system that can simultaneously: A) operate with a full capacity of liquid helium, B) operate with a maximum pressure substantially below 757 atmospheres, C) operate with positive pressure at all temperatures, and D) cycle between room and cryogenic temperatures without releasing helium. Neither sealed buffer systems nor prior-art externally connected buffer systems can simultaneously achieve all four of these characteristics.

While the foregoing description includes many details, specificities, benefits and advantages; it is to be understood that these have been included for purposes of explanation only and are not to be interpreted as limitations of the appended claims unless expressly stated by the claims. It will be apparent to those skilled in the art that other modifications to the embodiments described above can be made without departing from the spirit and scope of the invention as claimed. Accordingly, such modifications are considered within the scope of the disclosure as intended to be encompassed by the following claims and their legal equivalents.

What is claimed is:

1. A thermal buffer system for augmenting the heat capacity of a cryogenic apparatus having a cold mass, said system comprising:
   a cold head in thermal contact with a cold mass of a cryogenic apparatus for the purpose of maintaining the cold mass at cryogenic temperatures;
   at least one first vessel disposed in thermal contact with the cold mass, said first vessel being suited for containing cryogenic liquids;
   a connection pipe configured to allow gas to move between the interior of the first vessel and exterior portions of the cryogenic apparatus;
   a manifold attached to the connection pipe, at least a portion of said manifold placed exterior to the cryogenic apparatus;
   a port in the manifold that is suitable for introducing gas into the manifold from an external gas supply; and
   at least one second room temperature vessel connected to the manifold configured so that gas can freely move between the first vessel and the second room temperature vessel.

2. The system of claim 1, wherein a plurality of first vessels are disposed in thermal contact with the cold mass and connected to the connection pipe.

3. The system of claim 1, wherein a plurality of second room temperature vessels are connected to the manifold.

4. The system of claim 1, wherein a pressure relief valve is attached to the manifold.

5. The system of claim 1, wherein an evacuation port is attached to the manifold.

6. The thermal buffer system of claim 1, wherein:
   the pressure within the first vessel, connection pipe, manifold and second room temperature vessel is maintained at a selected pressure by a pressure maintenance system.

7. The thermal buffer system of claim 6, wherein:
   the pressure maintenance system maintains pressure within the first vessel, connection pipe, manifold and second room temperature vessel to a pressure below atmospheric pressure.

8. The thermal buffer system of claim 6, wherein:
   the pressure maintenance system maintains pressure within the first vessel, connection pipe, manifold and second room temperature vessel to a pressure equal to atmospheric pressure.

9. The thermal buffer system of claim 6, wherein:
   the pressure maintenance system maintains pressure within the first vessel, connection pipe, manifold and second room temperature vessel to a pressure above atmospheric pressure.

10. The thermal buffer system of claim 6, wherein a one way valve is inserted between the pressure maintenance system and the manifold.

11. The system of claim 1, wherein a pressure sensor is attached to the manifold.

12. The system of claim 1, wherein the second room temperature vessel is surrounded by thermal insulation.

13. The system of claim 1, wherein the manifold is surrounded by thermal insulation.

14. The system of claim 1, wherein volume of the second room temperature vessel is selected to be a ratio, R, of the volume of the first vessel.

15. The system of claim 14, wherein the ratio, R, is used to estimate a maximum pressure expected in the system.

16. The system of claim 15, wherein a pressure relief valve is attached to the manifold and the release pressure of the pressure relief valve is selected to be equal to the estimated maximum pressure expected in the system.

17. The system of claim 15, wherein a pressure relief valve is attached to the manifold and the release pressure of the pressure relief valve is selected to be above the estimated maximum pressure expected in the system.

18. The system of claim 1, wherein the system is used in a superconducting magnet.

19. The system of claim 18, wherein the superconducting magnet is used in a magnetic resonance imaging magnet.

20. The system of claim 18, wherein the superconducting magnet is used in a particle accelerator.

21. The system of claim 18, wherein the superconducting magnet is used to control crystal growth.

22. A method to increase the thermal mass of a cryogenic apparatus, said method comprising steps of:
   providing a first buffer vessel disposed within the cryogenic apparatus with said first buffer vessel containing a liquid cryogen;
   providing a second room temperature buffer vessel located outside of the cryogenic apparatus and fluidically connected to the first buffer vessel;
   providing a port for filling the interconnected first buffer vessel and second room temperature buffer vessel with a selected gas; and
   operating a pressure relief valve to allow gas to escape the interconnected first buffer vessel and second room temperature buffer vessel in the event pressure exceeds a selected threshold.

23. The method of claim 22, wherein the selected pressure for configuring the relief valve is chosen to be a function of the ratio of the volumes of the first buffer vessel and the second room temperature buffer vessel.

24. The method of claim 22, wherein the ratio of the volumes of the first buffer vessel and the second room temperature buffer vessel is chosen to be a function of the selected threshold pressure of the pressure relief valve.

25. The method of claim 22, further comprising maintaining a constant gas pressure in the interconnected second room temperature buffer vessel and first buffer vessel.

26. The method of claim 25, wherein the selected pressure is above atmospheric pressure.

27. The method of claim 22, further comprising configuring the volume of the first vessel, the volume of the second room temperature buffer vessel, the amount of gas introduced into the interconnected vessels, and the selected pressure threshold of the pressure relief valve so that over a selected range of operational temperatures for the first buffer vessel varying from a selected room temperature to cryogenic temperatures suitable for the formation of liquid cryogens:
   the first buffer vessel is full of liquid cryogen when the first buffer vessel is at a cold temperature suitable for the formation of liquid cryogens;
   the maximum pressure within the interconnected first buffer vessel and second room temperature buffer vessel is below 757 atmospheres for all operational temperatures experienced by the low temperature buffer vessel;
   the pressure within the interconnected first buffer vessel and second room temperature buffer vessel exceeds atmospheric pressure for all operational temperatures experienced by the first buffer vessel, and
   the pressure relief valve does not release any gas for all operational temperatures experienced by the first buffer vessel.

28. The method of claim 22, wherein:
   the first buffer vessel is comprised of a plurality of vessels.

29. The method of claim 22, wherein:
   the second room temperature buffer vessel is comprised of a plurality of vessels.

* * * * *